United States Patent
Spahn

(10) Patent No.: US 7,622,719 B2
(45) Date of Patent: Nov. 24, 2009

(54) CMOS FLAT X-RAY DETECTOR

(75) Inventor: Martin Spahn, Chicago, IL (US)

(73) Assignee: Siemens Aktiengesellschaft, Munich (DE)

( * ) Notice: Subject to any disclaimer, the term of this patent is extended or adjusted under 35 U.S.C. 154(b) by 178 days.

(21) Appl. No.: 11/525,966

(22) Filed: Sep. 25, 2006

(65) Prior Publication Data

US 2007/0069111 A1 Mar. 29, 2007

(30) Foreign Application Priority Data

Sep. 26, 2005 (DE) ........................ 10 2005 045 895

(51) Int. Cl.
*H01L 27/00* (2006.01)

(52) U.S. Cl. .................................. 250/370.11

(58) Field of Classification Search ............. 250/208.1, 250/361 R, 367, 368, 370.09, 370.11, 580; 378/98.8

See application file for complete search history.

(56) References Cited

U.S. PATENT DOCUMENTS

| | | | | |
|---|---|---|---|---|
| 4,467,342 | A * | 8/1984 | Tower | 257/443 |
| 4,755,681 | A * | 7/1988 | Oka et al. | 250/370.01 |
| 5,336,879 | A * | 8/1994 | Sauer | 250/208.1 |
| 5,528,043 | A * | 6/1996 | Spivey et al. | 250/370.09 |
| 5,834,782 | A * | 11/1998 | Schick et al. | 250/370.11 |
| 5,886,353 | A * | 3/1999 | Spivey et al. | 250/370.09 |
| 6,207,944 | B1 * | 3/2001 | Spartiotis et al. | 250/208.1 |
| 6,362,482 | B1 * | 3/2002 | Stettner et al. | 250/370.08 |
| 6,408,110 | B2 * | 6/2002 | Schulman | 382/312 |
| 6,429,414 | B1 * | 8/2002 | Spahn | 250/208.1 |
| 6,452,186 | B1 * | 9/2002 | Wieczorek et al. | 250/370.11 |
| 6,718,011 | B2 | 4/2004 | Spahn | |
| 6,763,084 | B2 | 7/2004 | Boehm et al. | |
| 7,009,646 | B1 * | 3/2006 | Fossum et al. | 348/294 |
| 7,117,588 | B2 * | 10/2006 | Vafi et al. | 29/829 |
| 2003/0155515 | A1 * | 8/2003 | Moy et al. | 250/361 R |
| 2003/0200655 | A1 | 10/2003 | Vafi et al. | |
| 2004/0000630 | A1 * | 1/2004 | Spartiotis et al. | 250/208.1 |

(Continued)

FOREIGN PATENT DOCUMENTS

DE 198 41 419 C2 7/2000

(Continued)

OTHER PUBLICATIONS

Abstract translation of EP0421869A1.*

*Primary Examiner*—David P Porta
*Assistant Examiner*—Djura Malevic
(74) *Attorney, Agent, or Firm*—Harness, Dickey & Pierce, P.L.C.

(57) ABSTRACT

A large-area CMOS flat X-ray detector is disclosed. The detector includes a plurality of CMOS detector chips, mounted on a substrate with a butt joint. Two alternative embodiments of the CMOS detector chips are described. In the first embodiment, drive elements and read elements are provided on two of four edges of the chip. If the connecting lines are routed to the first edge, this allows an embodiment in which more than four such CMOS detector chips are fitted alongside one another. In one alternative embodiment, all the drives and read operations can be carried out from a first edge so that at least six such CMOS detector chips can be adhesively bonded on the substrate alongside one another.

13 Claims, 4 Drawing Sheets

U.S. PATENT DOCUMENTS

2004/0200971 A1* 10/2004 De Keyser .............. 250/370.09
2005/0230631 A1* 10/2005 Kuhlmann .............. 250/370.11

FOREIGN PATENT DOCUMENTS

| DE | 100 58 388 C1 | 8/2002 |
| DE | 698 19 935 T2 | 11/2004 |
| EP | 421869 A1 * | 4/1991 |
| EP | 0 700 582 B1 | 7/1998 |

* cited by examiner

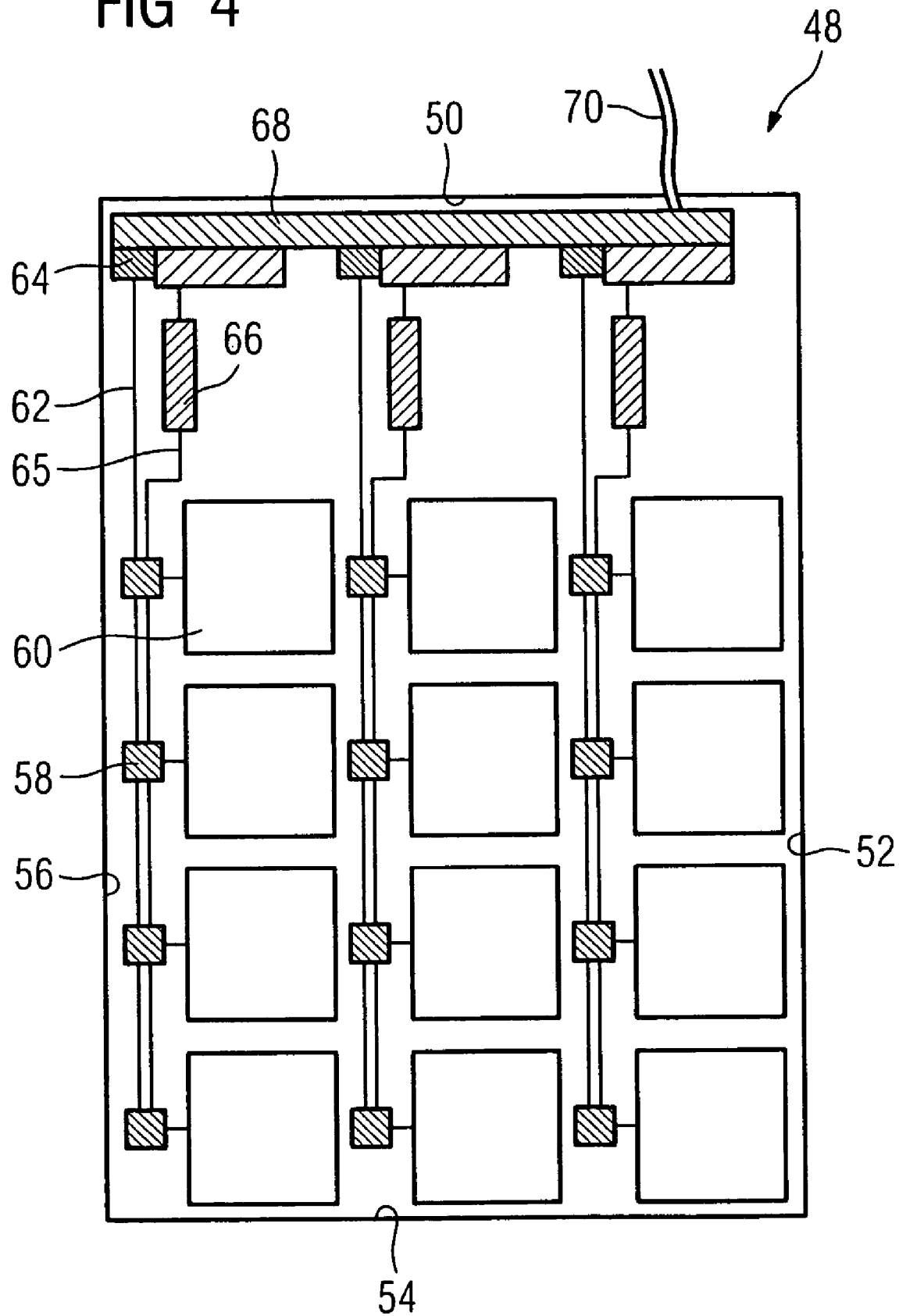

CMOS FLAT X-RAY DETECTOR

PRIORITY STATEMENT

The present application hereby claims priority under 35 U.S.C. §119 on German patent application number DE 10 2005 045 895.5 filed Sep. 26, 2005, the entire contents of which is hereby incorporated herein by reference.

FIELD

The invention generally relates to a large-area flat X-ray detector; for example one based on CMOS technologies. No such flat X-ray detector are known to exist in the prior art.

BACKGROUND

Digital detectors are being increasingly used for medical X-ray imaging. Digital flat X-ray detectors based on amorphous silicon are in widespread use. Photoelements which allow signals to be produced on a detector-element basis are formed in the amorphous silicon. A layer of cesium iodide is applied as a scintillator to the amorphous silicon chip and converts X-ray light that is incident on the detector to visible light for the photoelements on the amorphous silicon chip.

CMOS technologies would allow a range of improvements in comparison to chips composed of amorphous silicon. For example, amplifiers could be provided on the detector element to improve the signal-to-noise ratio. Automatic dose measurement (AEC, Automatic Exposure Control) can be integrated on the chip, and the detectors may be counting detectors.

However, CMOS technology also has the disadvantage that, on an area basis, it is very expensive. The known cost reduction in the case of computer chips is due to the fact that the chips are becoming ever smaller. However, the size of flat X-ray detectors is governed by the area of the organs to be imaged by the X-ray technique (thorax, skull, etc.). The intrinsic requirement would be for a large-area CMOS detector with an area of 43×43 $cm^2$. However, the largest areas of the most modern systems nowadays do not achieve wafer diameters of more than about 30 cm (12 inches), so that the maximum possible square area is somewhat more than 20×20 $cm^2$.

It is thus intrinsically not possible to use CMOS-based flat detectors from the prior art.

SUMMARY

In at least one embodiment of the invention, CMOS technology is used for the production of a large-area CMOS flat X-ray detector.

In at least one embodiment of the invention, a plurality of CMOS detector chips is mounted on a substrate with a butt joint.

The butt-joint technique is generally known from amorphous silicon chips. However, this has not yet been used in conjunction with CMOS technology. Butt-jointing refers to chips that are adhesively bonded in place, and are joined closely to one another. Detector elements are provided on the chips on both sides of the adhesion point at which the two chips abut against one another, thus resulting in a continuous area of detector elements arranged alongside one another, interrupted only by the adhesion point.

The reason why butt-jointing has so far not yet been used for CMOS detector chips is that the production of a point at which two chips are joined to one another prevents access to the detector elements on the chip from all four sides.

At least one embodiment of the invention also includes the idea of the elements being arranged in a specific manner, which allows butt-jointing, on the CMOS detector chip.

According to a first alternative embodiment, drive elements for driving detector element columns on the chip are provided on a first edge on each CMOS detector chip with four edges (that is to say a rectangular detector chip) and read elements for line-by-line reading of detector elements are provided on a second edge, at right angles to the first edge. Detector elements are arranged on the third and the fourth edge of the CMOS detector chip.

The respective third and fourth edges of the various CMOS detector chips can thus be brought into contact with one another without having to leave space available for any connections. For the first time, therefore, this makes possible the closed, continuous area as mentioned above, interrupted only by an adhesive line, composed of mutually adjacent detector elements.

The read elements are preferably read via a multiplexer on the chip, whose connecting lines are accessible from the first edge. This avoids connections on the second edge.

This embodiment allows a particular type of butt-joint in which not only is it possible for four such rectangular CMOS detector chips to butt against one another in order to form a CMOS flat X-ray detector, but in which more than four such CMOS detector chips butt-jointed to one another can also form a CMOS flat X-ray detector. This increases the total available area. The particular type of butt-jointing has the appearance of the CMOS detector chips being arranged like shingles on one another. In this case, parts of one detector chip in each case rest on the adjacent detector chip. In particular, one section of one detector chip on which detectors are arranged (on the fourth edge) is in each case preferably located above one section of an adjacent other detector chip, on which read elements and preferably the multiplexer are arranged (that is to say above the second edge). A plan view of the detector then shows a closed sequence of detector elements, because the read elements are concealed.

The concealment of the read elements does not mean that these do not operate, but that they can be checked via the side connection of the multiplexer.

In any case, the CMOS flat X-ray detector according to an embodiment of the invention also has an X-ray converter (scintillator), which converts the X-ray radiation to visible light for detection by detector elements on the CMOS detector chips. In this case, it is advantageous for the X-ray converter to have a horizontally planar lower face. In order to match this lower face to the shingle-like arrangement, a filling material must then be inserted between this planar lower face and the surface of the shingle-like arrangement which has a "zigzag"-shaped section. This filling material must satisfy the requirement that it is sufficiently robust to hold the X-ray converter, while on the other hand not impeding the signal evaluation or signal propagation.

If an indirect X-ray converter is used, the filling material should be composed of an optically translucent adhesive, to which the indirect X-ray converter is firmly bonded. Examples of indirect X-ray converters are GOS and CsI.

If a direct X-ray converter is used, then the filling material may, however, also be composed of the same material as the direct X-ray converter, or of a conductive material. If the filling material is composed of the same material as the direct X-ray converter, this, of course, no longer has any effectively separated horizontally planar termination.

A further alternative for the configuration of the CMOS detector chips uses CMOS technology in such a way that detector elements are in each case provided on the second to fourth edge of the rectangular CMOS detector chip, and drive elements and read elements are provided at the same time on only one edge.

This embodiment can be implemented by providing a logic element for each detector element, allowing clocked driving of the detector elements line-by-line, from the first edge. In this case, as well, a multiplexer is preferably provided on the first edge and controls the column-by-column reading when being clocked. Clocking on the one hand and multiplexing on the other hand allow information to be read from the detector elements, from only one side.

Any desired number of CMOS detector chips such as these can be joined to one another in pairs, thus making it possible to form an elongated CMOS flat X-ray detector. In a corresponding manner, the CMOS flat X-ray detector contains at least six CMOS detector chips, that is to say more than the four detector chips, which can normally be joined to one another using the butt-jointing technique (particularly when using amorphous silicon technology).

At least one embodiment of the invention also relates to CMOS detector chips according to the first and second alternatives, which are suitable for butt-jointing on a substrate.

BRIEF DESCRIPTION OF THE DRAWINGS

Example embodiments of the invention will now be described with reference to the drawings, in which:

FIG. 4 shows a single CMOS detector chip for implementation of the embodiment shown in FIG. 3, with further details.

DETAILED DESCRIPTION OF THE EXAMPLE EMBODIMENTS

Figure 1A:
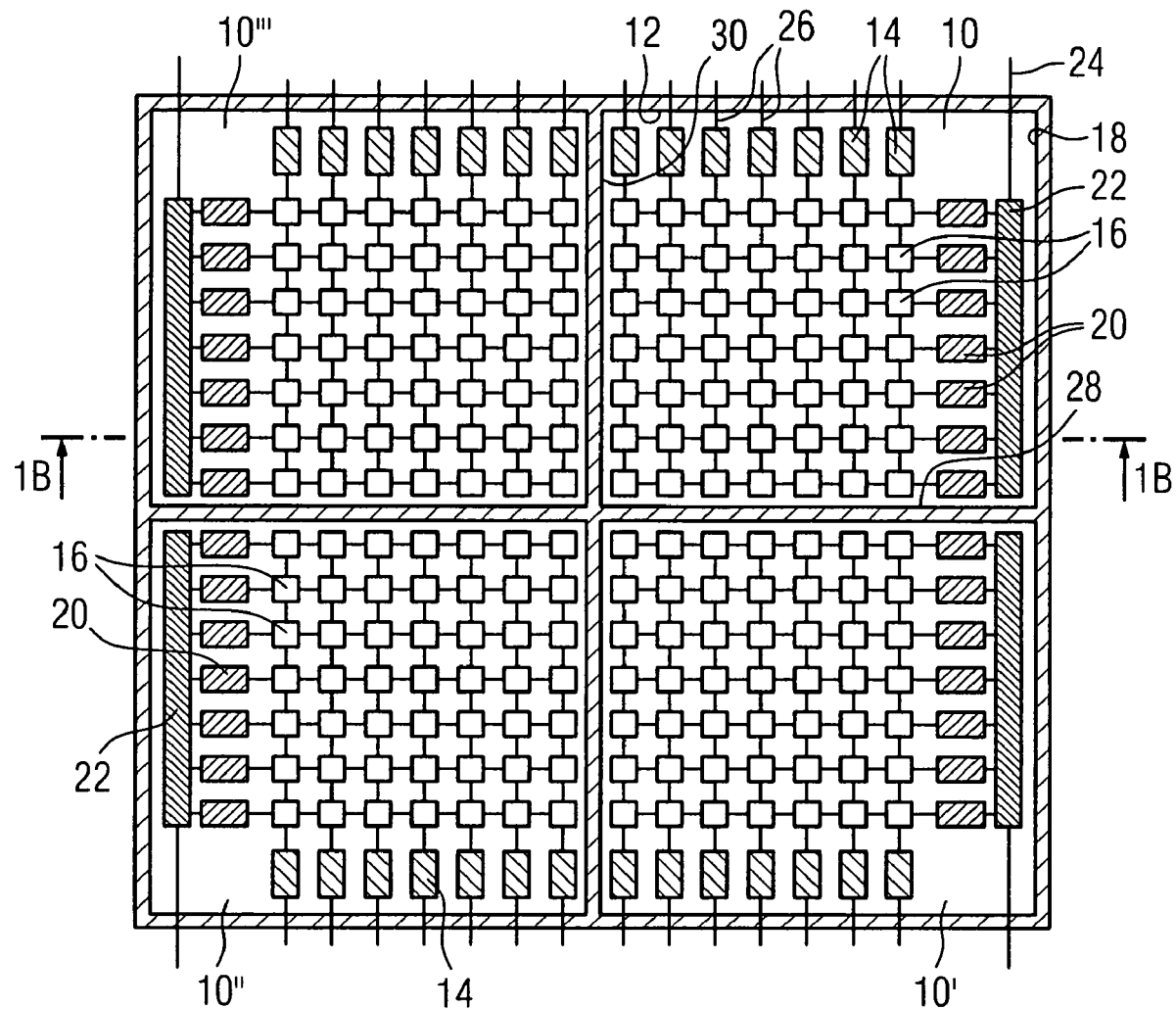
FIG. 1A shows a plan view of an flat X-ray detector, comprising four detector chips, according to an embodiment of the invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described.

In order to allow butt-jointing of CMOS detector chips, these CMOS detector chips are designed as shown in FIG. 1A: drive elements and read elements are provided only on a first edge and a second edge, and detector elements are provided on a third edge and a fourth edge.

A first edge 12 on which drive elements 14 (which can drive individual columns of detector elements 16 on the chip) are provided, is provided on a CMOS detector chip 10. Since only one column is ever driven at one time, reading line-by-line is sufficient, during which process the element from the respective line and from the respective column can be read. Read amplifiers 20 are provided for reading purposes on a second edge 18 of the chip 10, and are read via a multiplexer 22. A connecting line 24 for reading the multiplexer 22 is routed, to the first edge 12, on which the supply lines 26 for the drive elements 14 are located at the same time. All of the lines to and from the chip are thus accessible from the first edge 12, that is to say from only four sides.

The detector elements 16 extend on the chip as far as a third edge 28 on the one hand and as far as the fourth edge 30 on the other hand. Four chips 10, 10', 10", and 10''' can thus be joined to one another by means of a butt-joint, resulting in a virtually closed area of detector elements 16, which are separated only by a small "adhesive trench". FIG. 1A shows a butt joint such as this in which there are no detector lines or detector columns. The individual detector elements 16 of the chips 10, 10', 10", 10''' are thus joined together to form a closed CMOS flat X-ray detector area. If the cut edges cannot be placed so close to the detectors, an empty column or empty line can also be provided in the CMOS flat X-ray detector area.

Figure 1B:
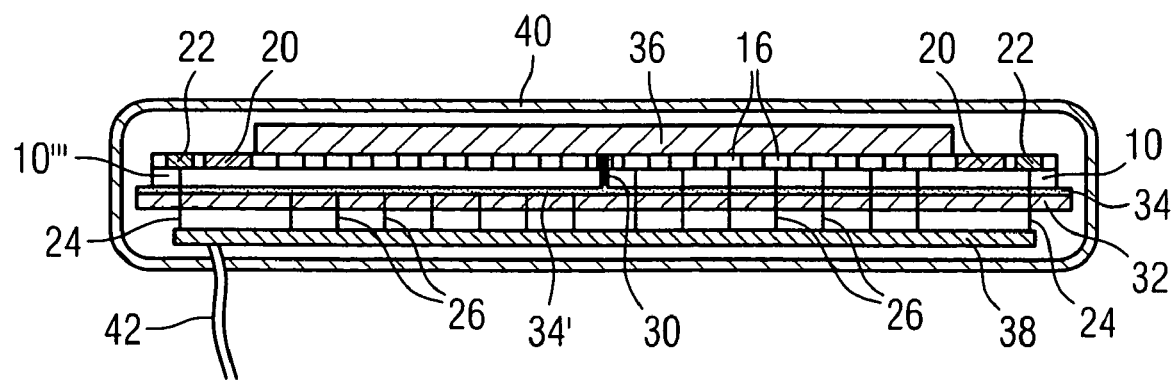
FIG. 1B shows a side view of the CMOS flat X-ray detector shown in FIG. 1A.

FIG. 1B shows a side view of the CMOS flat X-ray detector shown in FIG. 1A. In this case, 32 denotes a substrate on which CMOS chips 10 and 10''' are adhesively bonded. The butt-jointing adhesive 34 is located between the chips 10 and 10''' and the substrate 32, and is located on the surface of the substrate 32. The adhesive enters the area between the two chips 10 and 10''' only in the area of the actual butt-jointing zone 34, that is to say on the edge 30 of the first chip 10 and on the corresponding edge of the second chip 10'''. This is indicated by being shown in black.

The X-ray converter (scintillator) 36 is located on the individual chips 10, 10''' forming a closed layer.

An electronics board 38, to which the connections are routed is located under the substrate. The entire arrangement surrounds a detector housing 40, out of which supply lines are passed, which form an interface 42 to the electronics board 38, that is to say in the end to the supply lines 24 and 26.

The embodiment of the chips in such a manner that the supply lines are all accessible from one edge 12 can be used particularly advantageously for provision of a particular type of butt-joint, which is illustrated in FIG. 2.

Figure 2A:
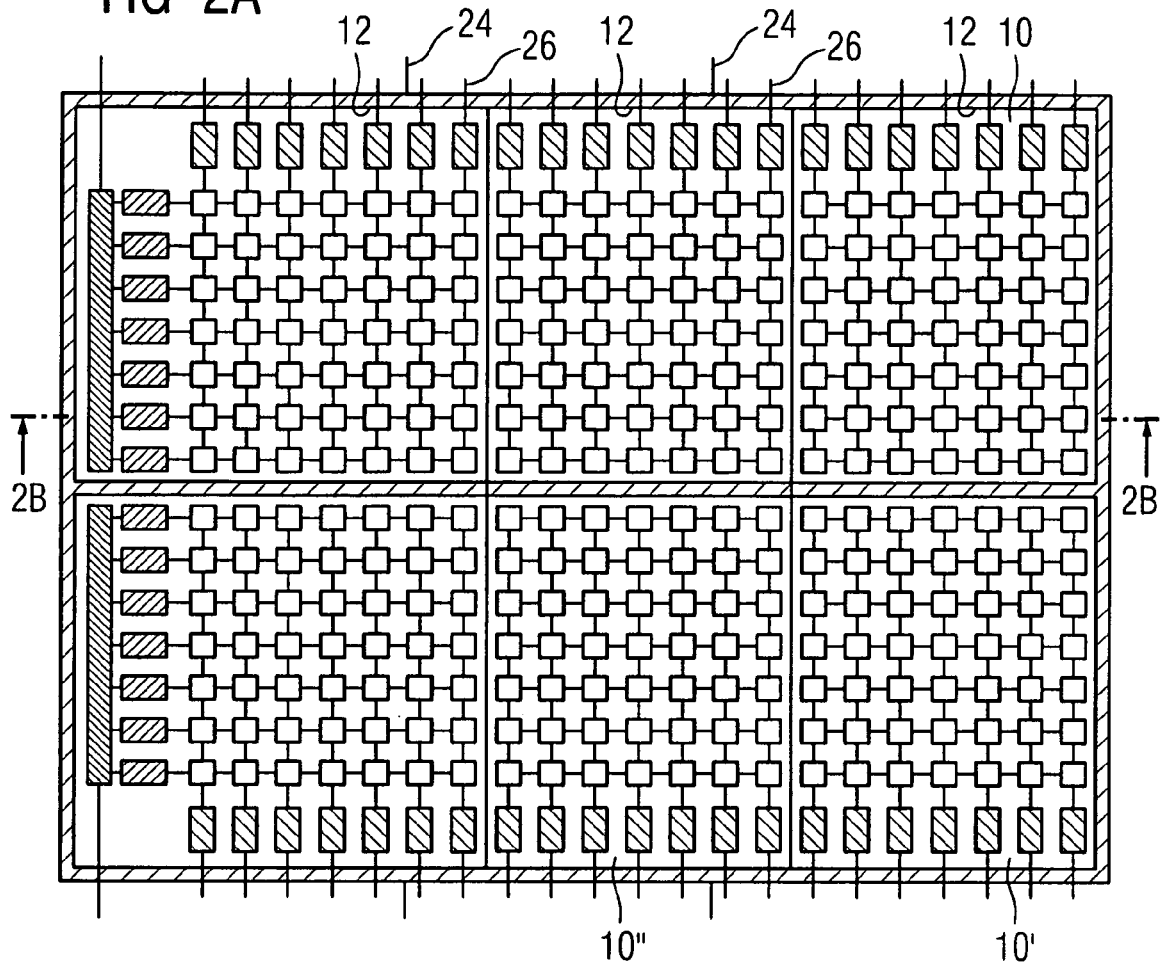
FIG. 2A shows a plan view of a CMOS flat X-ray detector, according to one alternative of an embodiment of the invention, with the butt-jointing technique used in this case being illustrated in particular in FIG. 2B, with FIG. 2B showing a side view of the CMOS flat X-ray detector from FIG. 2A.
Figure 2B:
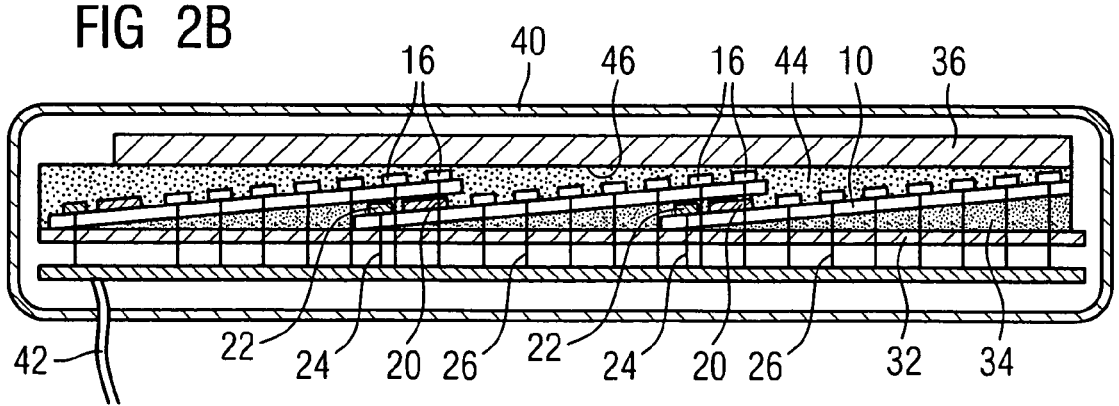

As can be seen particularly well in the side view in FIG. 2B, the same detector chips 10 as are known from FIG. 1 are now arranged in the form of shingles on one another.

In this case, one edge, on which detector elements 16 are arranged, of one section is in each case arranged above a section on which the read amplifier 20 and the multiplexer 22 are arranged. The read amplifier 20 and the multiplexer 22 are thus concealed. A closed area of detector elements is thus formed, as is shown in FIG. 2A. In particular, more than four CMOS detector chips 10 can be arranged on a substrate 32 in this manner. While two such chips 10 and 10' can always be arranged alongside one another (one above the other in FIG. 2A), then any desired number of chips to be arranged adjacent to one another can be provided in the other direction, that is to say at the side as seen in FIG. 2A. FIG. 2A shows a total number of six chips, although in theory further chips could be inserted on the right-hand side. In any case, the total of six chips is greater than the total of four chips used in butt-jointing until now.

In this case, in particular, use is made of the fact that the line 24 from the multiplexer 22 is in each case routed to the side to the first edge 12, so that a central chip 10'' (see FIG. 2A) can have three sides adjacent to other chips, at least in plan view.

In order to hold the chips 10 in the shingle-like arrangement shown in FIG. 2B, the adhesive 34 must make the arrangement robust. The illustration in this case shows the adhesive in each case being arranged in the form of a ramp under the individual chips 10. Filling material 44 should be introduced on to the junction to the X-ray converter 36, creating the junction to a horizontally planar lower face 46 of the X-ray converter. In the illustrated situation, the filling material is composed of a different material to that of the X-ray converter, and, for example, may be an optically translucent adhesive while an indirect X-ray converter, for example composed of cesium iodide, is used.

Figure 3:
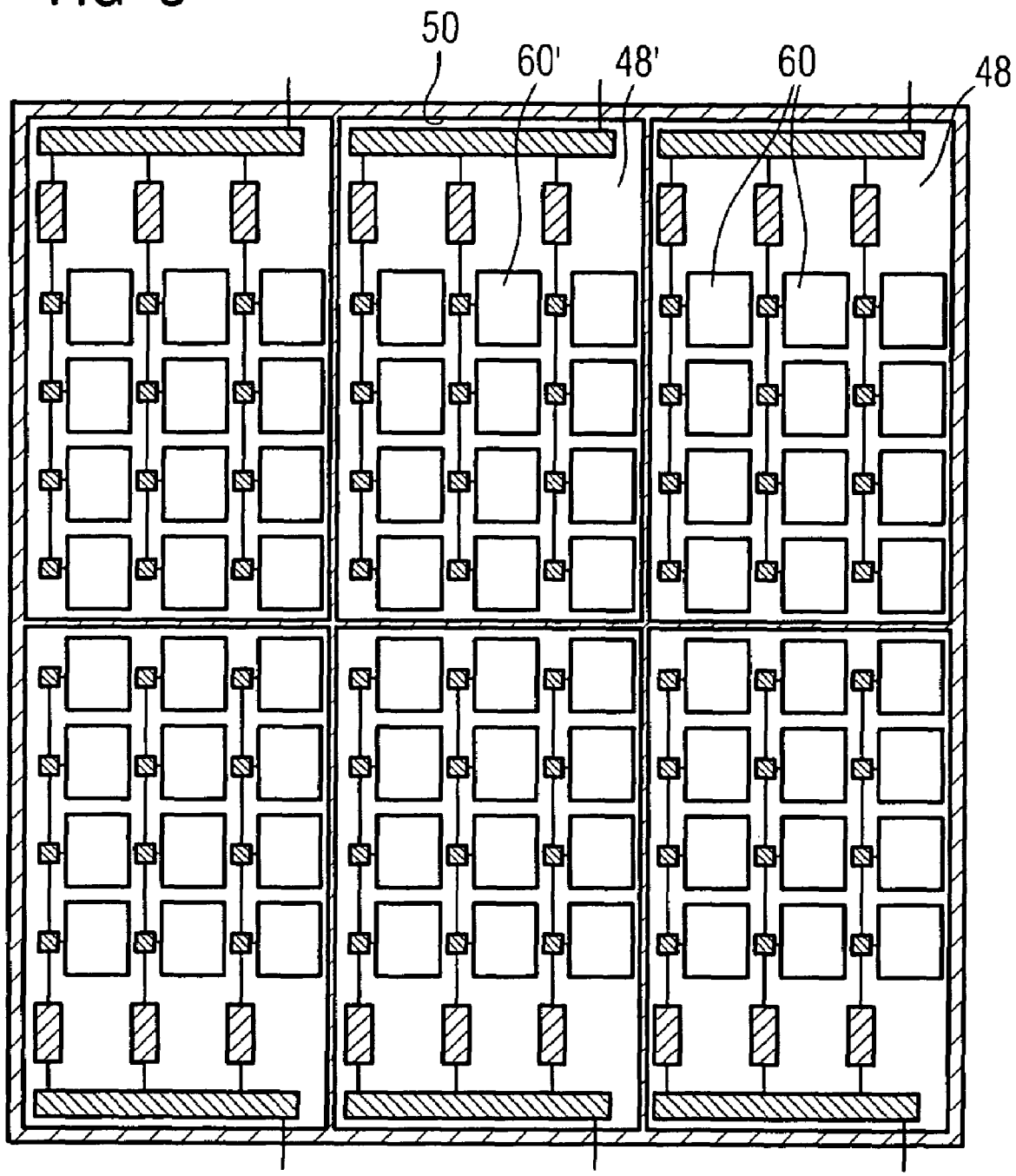
FIG. 3 shows a plan view of a CMOS flat X-ray detector, according to a further embodiment of the invention.

FIG. 3 shows a further alternative for the provision of butt-jointing of suitable CMOS detector chips. One such chip is illustrated individually in FIG. 4. The individual CMOS detector chip 48 is distinguished by drive elements and read elements being provided (at the same time) on only a single edge of the rectangular CMOS detector chip, with detector elements being provided in each case on the second to fourth edges. In this case, the first edge is annotated 50, and the second edge, on which detector elements are provided, is annotated 52, the third edge, on which detector elements are provided, is annotated 54, and the fourth edge, on which detector elements are provided, is annotated 56. In this case, the expression "are provided on the edge" means that the detector elements can be fitted with the normal detector separation with respect to detector elements on an adjacent butt-jointed chip.

In FIG. 4, in particular logic elements and switching transistors are annotated 58, which occupy a sufficiently small amount of space in order to regard the detector element 60 as actually still being located at the edge 56. In the illustration in FIG. 3, the lateral distance between two detector elements 60 is, in fact, no greater than the distance from one detector element 60 on the chip 48 to a detector element 60' on the chip 48'. However, in this case as well, it may be necessary to provide a blank line or blank column in the CMOS flat X-ray detector area for cut edges which cannot be placed so close to the detectors at the edge.

The drive logic elements and switching transistors 58 allow, in particular, clocked driving of the individual detector lines. These drive signals are sent from a drive element 64 to the logic elements 58 via a first line 62. Interrogation is then carried out column-by-column via second lines 65, the read amplifiers 66 and a read signal multiplexer 68. The supply line to the electronics board can be provided on a single point, and is annotated with 70 in the illustration of FIG. 4.

The embodiment shown in FIG. 3 and FIG. 4 uses the CMOS technology in a particular manner to provide a CMOS detector chip which can be butt-jointed particularly well. The use of drive logic elements and switching transistors such as the elements 58 matching the detector elements (photoelements) 60 is thus not known from amorphous silicon technology. In this case, as well, it is also possible to arrange two adjacent CMOS detector chips in one dimension (from top to bottom in FIG. 3) but any desired number of CMOS detector chips in the other dimension (from left to right in FIG. 3). This makes it easier to produce a large-area CMOS flat X-ray detector.

At least one embodiment of the invention for the first time provides a CMOS flat X-ray detector having a plurality of CMOS detector chips. Butt-jointing of CMOS detector chips such as these is made possible in particular by the special refinements of these CMOS detector chips in which case it has been shown that, in the case of two different embodiments as shown in FIG. 2 and FIG. 3, butt-jointing with at least six different CMOS detector chips is possible, so that the individual chips need not be produced to be excessively large.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A CMOS flat X-ray detector, comprising:
   a plurality of CMOS detector chips, mounted on a substrate with a butt joint;
   drive elements configured to drive detector element columns on a chip, the drive elements being provided on a first edge on each rectangular CMOS detector chip;
   read elements for line-by-line reading of detector elements, provided on a second edge at right angles to the first edge; and
   detector elements provided on third and fourth edges of the chip, wherein
       the CMOS detector chips are arranged like shingles on one another, with one section of one detector chip, on which detectors are arranged, being located above one section of an adjacent other detector chip, on which read elements are arranged, in such a manner that a closed sequence of detector elements is seen in a plan view of the detector, and
       an X-ray converter is arranged on the shingle-like arrangement, with filling material for matching to a horizontally planar lower face of the X-ray converter being provided between the X-ray converter and the chip.

2. The CMOS flat X-ray detector as claimed in claim 1, wherein an indirect X-ray converter is used, and wherein the filling material is composed of optically translucent adhesive.

3. The CMOS flat X-ray detector as claimed in claim 1, wherein an direct X-ray converter is used, and wherein the filling material is composed of at least one of the same materials as the direct X-ray converter and a conductive material.

4. The CMOS flat X-ray detector as claimed in claim 1, wherein the detector chips are supported in an inclined position relative to the substrate by an adhesive between the chips and the substrate.

5. The CMOS flat X-ray detector as claimed in claim 4, wherein the adhesive forms a ramp.

6. The CMOS flat X-ray detector as claimed in claim 1, wherein the filler is deposited over the detector chips forming a planar surface.

7. The CMOS flat X-ray detector as claimed in claim 1, wherein the detector chips are arranged on a common plane.

8. The CMOS flat X-ray detector as claimed in claim 1, wherein each detector element includes a separate logic element.

9. A CMOS flat X-ray detector, comprising:
a plurality of CMOS detector chips, mounted on a substrate with a butt joint;
drive elements configured for driving detector element columns on a chip, provided on a first edge on each rectangular CMOS detector chip;
read elements for line-by-line reading of detector elements, provided on a second edge at right angles to the first edge; and
detector elements provided on third and fourth edges of the chips, wherein
   the read elements are read via a multiplexer on the chip, whose connecting lines are accessible from the first edge,
   the CMOS detector chips are arranged like shingles on one another, with one section of one detector chip, on which detectors are arranged, being located above one section of an adjacent other detector chip, on which read elements are arranged, in such a manner that a closed sequence of detector elements is seen in a plan view of the detector, and
   an X-ray converter is arranged on the shingle-like arrangement, with filling material for matching to a horizontally planar lower face of the X-ray converter being provided between the X-ray converter and the chip.

10. The CMOS flat X-ray detector as claimed in claim 9, wherein an indirect X-ray converter is used, and wherein the filling material is composed of optically translucent adhesive.

11. The CMOS flat X-ray detector as claimed in claim 9, wherein a direct X-ray converter is used, and wherein the filling material is composed of at least one of the same material as the direct X-ray converter and a conductive material.

12. A CMOS flat X-ray detector, comprising:
a plurality of CMOS detector chips, mounted on a substrate with a butt joint;
drive elements and read elements, provided on only one edge of the rectangular CMOS detector chips;
detector elements, provided on a second to a fourth edge of the chips; and
a logic element, provided for each detector element, to allow clocked driving of the detector elements line-by-line from the first edge, wherein a multiplexer on the first edge controls the column-by-column reading when being clocked, wherein
   the CMOS detector chips are arranged like shingles on one another, with one section of one detector chip, on which detectors are arranged, being located above one section of an adjacent other detector chip, on which read elements are arranged, in such a manner that a closed sequence of detector elements is seen in a plan view of the detector, and
   an X-ray converter is arranged on the shingle-like arrangement, with filling material for matching to a horizontally planar lower face of the X-ray converter being provided between the X-ray converter and the chip.

13. The CMOS flat X-ray detector as claimed in claim 12, comprising at least six CMOS detector chips.

* * * * *